United States Patent
Sachan et al.

(10) Patent No.: US 6,699,299 B2
(45) Date of Patent: Mar. 2, 2004

(54) COMPOSITION AND METHOD FOR POLISHING IN METAL CMP

(75) Inventors: Vikas Sachan, Hockessin, DE (US); Elizabeth A. (Kegerise) Langlois, Newark, DE (US); Qianqiu (Christine) Ye, Wilmington, DE (US); Keith G. Pierce, Colorado Springs, CO (US); Craig D. Lack, Wilmington, DE (US); Terence M. Thomas, Newark, DE (US); Peter A. Burke, Avondale, PA (US); David Gettman, Bear, DE (US); Sarah Lane, Elkton, MD (US)

(73) Assignee: Rodel Holdings, Inc., Wilmington, DE (US)

( * ) Notice: Subject to any disclaimer, the term of this patent is extended or adjusted under 35 U.S.C. 154(b) by 22 days.

(21) Appl. No.: 10/393,074

(22) Filed: Mar. 20, 2003

(65) Prior Publication Data

US 2003/0181046 A1 Sep. 25, 2003

Related U.S. Application Data

(62) Division of application No. 09/859,147, filed on May 16, 2001, which is a continuation of application No. 09/329,225, filed on Jun. 10, 1999, now abandoned.
(60) Provisional application No. 60/088,849, filed on Jun. 10, 1998.

(51) Int. Cl.$^7$ .............. B24B 1/00; H01L 21/02; H01L 21/304; C09G 1/04
(52) U.S. Cl. .......... 51/298; 438/691; 438/692; 451/36; 106/3
(58) Field of Search .......... 51/307, 308, 309, 51/298; 106/3; 451/36; 438/691, 692

(56) References Cited

U.S. PATENT DOCUMENTS

| | | | | |
|---|---|---|---|---|
| 5,476,606 A | * | 12/1995 | Brancaleoni et al. | ...... 252/79.1 |
| 5,614,444 A | * | 3/1997 | Farkas et al. | ............... 438/693 |
| 5,738,800 A | * | 4/1998 | Hosali et al. | ................. 216/99 |
| 5,770,103 A | * | 6/1998 | Wang et al. | ............... 252/79.1 |
| 5,876,490 A | * | 3/1999 | Ronay | ............................ 106/3 |

* cited by examiner

*Primary Examiner*—Michael Marcheschi
(74) *Attorney, Agent, or Firm*—Kenneth A. Benson; Blake T. Biederman

(57) ABSTRACT

A composition is provided in the present invention for polishing a composite semiconductor structure containing a metal layer (such as tungsten, aluminum, or copper), a barrier layer (such as tantalum, tantalum nitride, titanium, or titanium nitride), and an insulating layer (such as $SiO_2$). The composition comprises an aqueous medium, an oxidant, an organic polymer that attenuates removal of the oxide film. The composition may optionally comprise a complexing agent and/or a dispersant.

21 Claims, No Drawings

COMPOSITION AND METHOD FOR POLISHING IN METAL CMP

CROSS REFERENCE TO RELATED APPLICATIONS

This application is a division of application Ser. No. 09/859,147 filed May 16, 2001, which is a continuation of application Ser. No. 09/329,225, filed Jun. 10, 1999, now abn, which claims the benefit of provisional application serial No. 60/088,849 filed Jun. 10, 1998.

BACKGROUND OF THE INVENTION

1. Field of the Invention

The invention described in this patent pertains to the polishing and planarization of integrated circuit surfaces, particularly those comprising a metal, a barrier layer, and an insulating layer.

2. Discussion of Related Art

Chemical/Mechanical Planarization (or polishing), or CMP, is an enabling technology used in the semiconductor industry to remove/planarize various thin films from the surface of semiconductor substrates during the production of integrated circuits. While initial applications of this technology focused on the polishing of dielectric films (such as $SiO_2$), polishing of metal films used for circuit interconnects is undergoing rapid growth. Currently, tungsten and aluminum are the most common metals used for interconnect structures. However, copper interconnects, coupled with low-k dielectrics, have the potential (when compared to $Al/SiO_2$) to increase chip speed, reduce the number of metal layers required, minimize power dissipation, and reduce manufacturing costs.

However, the challenges associated with the successful integration of copper interconnects are not trivial. A typical copper interconnect structure contains a trench formed in silicon dioxide (typically 10,000 angstroms deep and 1–100 microns wide) formed above the silicon substrate. A barrier layer of material (used to improve adhesion of the copper as well as inhibit the diffusion of copper into the dielectric structure) is typically deposited after the trench is formed, and is usually composed of either tantalum, tantalum nitride, titanium, or titanium nitride. This barrier material is also deposited on the horizontal dielectric surface above the trench. The barrier layer is typically <1000 angstroms thick. Copper is then deposited by chemical vapor deposition or electroplating on top of this structure in order to fill the trench structure. To insure complete filling of the trench, an overlayer of copper of 10,000–15,000 angstroms is usually required. CMP is then used to remove the overburden of copper above the trench and the horizontal barrier material above the trench. In order to do this successfully and economically, the copper removal should be as fast as possible, typically above 3000 angstroms/minute. Also, to avoid removal of the copper within the trench (typically referred to as "dishing"), removal of the barrier layer at rates comparable to that of the copper film are necessary. Additionally, to avoid degradation of the $SiO_2$ film beneath the barrier layer (typically referred to as "erosion"), and to improve global planarization, the removal rate of the underlying dielectric film should be as low as possible. In summary, the selectivity for the removal rate of the barrier film (tantalum, tantalum nitride, titanium, or titanium nitride) should be high with respect to the copper film, while the selectivity for the removal rate of the dielectric film ($SiO_2$) should be low (preferably <100:1).

To accomplish these requirements, a two-step polishing process using two different slurries has been proposed. In U.S. Pat. No. 5,676,587, Selective Polish Process for Titanium, Titanium Nitride, Tantalum, and Tantalum Nitride, a two-step process using first (1) a slurry to remove the majority of the metal film (such as tungsten or copper) and second (2) a slurry to remove the barrier film is proposed.

To suppress the removal rate of silicon dioxide during CMP processes, various additives have been previously suggested that passivate the silicon dioxide surface. In U.S. Pat. No. 5,614,444, Method of using Additives with Silica-Based slurries to Enhance Selectivity in Metal CMP, an additive comprising at least one polar component and one apolar component is suggested to suppress oxide removal. This patent lists a number of compounds containing both polar and non-polar groups, which are either anionic (potassium butylsulphate), cationic (tetrabutyl ammonium hydroxide), or non-ionic (butanol). However, this patent claims as a necessity both a polar and apolar component (group) to be present.

U.S. Pat. No. 5,876,490 polyelectrolytes are used to coat the abrasive particles in a slurry. The polyelectrolytes impart normal stress effects to the slurries. In solution, the polyelectrolytes exhibit normal stress effects and their adsorption on the abrasive particles impart the same behavior to the particles.

According to U.S. Pat. No. 5,876,490, in order to achieve planarization, the quantity of polyelectrolyte in the abrasive suspension is such that a fraction of the particles will be coated with the polyelectrolyte, while another fraction of the abrasive particles will remain uncoated. In order to achieve this, the weight percent of the polyelectrolyte should be about 5 to about 50 percent, preferably about 15 to about 30 percent by, weight, and most preferably about 20 percent by weight of the abrasive particles in the slurry. These ratios depend somewhat on the relative size of the abrasive particles and the polyelectrolyte.

The slurry compositions of U.S. Pat. No. 5,876,490 that contain the polyelectrolyte are preferably prepared by adding the polyelectrolyte to the slurry already containing the abrasive particles, thereby coating a fraction of the abrasive particles "in situ." In an alternative procedure, a fraction of the abrasive particles can be precoated and then admixed with the slurry containing the remaining abrasive particles which will be uncoated. In addition, it may be desirable to pretreat a portion of the abrasive particles to render them more susceptible to adsorption of the polyelectrolyte from the slurry.

U.S. Pat. Nos. 5,391,258; 5,476,606; 5,738,800; 5,770,103 describe compounds which in CMP slurries provide attenuation of silicon dioxide removal. These patents are hereby incorporated by reference and made a part of this specification.

SUMMARY OF THE INVENTION

The present invention is directed to one or more organic polymers which have surprisingly been found to attenuate the removal of the oxide film during metal CMP and offers an improvement over earlier slurries. This organic polymer is a high molecular weight organic polymer containing a carbon backbone with functional moieties extending from the backbone. The functional moieties interact strongly with the silicon dioxide surface so as to provide a protective layer that inhibits the removal of the silicon dioxide film at appreciable levels. The mechanism of interaction between the functional moieties and the hydroxyl surface is, though not limited to, that observed in the hydrogen bonding of polar species (such as the interaction of hydroxyl groups). The organic polymer is further defined as a high molecular weight organic material, having a degree of polymerization of at least 3 (i.e., 3 monomeric units polymerized into a molecule), more preferably more than 10, and most preferably greater than 50. The organic polymer comprises a plurality of moieties having affinity to surface groups (i.e., silanol and siloxane) contained on silicon dioxide surfaces. These moieties are commonly polar moieties, such as, but not limited to, hydroxy, carboxy, carbonyl, alkoxy, sulphonyl, and phosphonyl. Examples of this type of organic polymer molecule includes polyvinyl alcohol, polyvinylpyrrolidone, polymethylmethacrylate, polyformaldehyde, polyethylene oxide, polyethylene glycol, and polymethacrylic acid.

Many of these same compounds are mentioned as being useful for coating abrasive particles in U.S. Pat. No. 5,876,490 as discussed above. Their use as a silicon dioxide rate suppressant is not mentioned in '490. Moreover, the polyelectrolytes of the present invention have been found to be effective as a silicon dioxide rate suppressant at concentrations below about 5 percent by weight of the abrasive particles in a slurry. They have also been found to be effective when having a molecular weight of greater than about 10,000.

Another aspect of the present invention is a method of polishing a substrate comprising a metal and an insulator wherein the substrate is pressed against a polishing pad, the substrate and the pad are moved relative to each other, and a polishing composition is applied to said pad during the polishing operation. The polishing compositions of the present invention are useful for such methods.

DESCRIPTION OF PREFERRED EMBODIMENTS

The slurries used in this invention were prepared with the following general protocol. In every case, the chemical additives are first dissolved in deionized water. After all the chemical additives are dissolved in the deionized water, the pH is adjusted to the desired level. In a separate vessel, the abrasive package which is comprised of the inorganic oxide abrasive particles in deionized water is mixed. The pH of the abrasive package is also adjusted to the desired level. The final step in the slurry formulation preparation is the combining of the aqueous chemical package with the aqueous abrasive package. Contrary to prior art, a polyelectrolyte additive can be added into this aqueous solution without any special abrasive adsorption requirements.

Typically, the list of chemical additives includes an oxidizing agent, the organic polymer removal rate suppressant of this invention, and optionally a complexing agent and/or a dispersant. The order of mixing of this chemical package need only be chosen such that there is complete solubilization of all the additives.

A complex as defined in "Advanced Inorganic Chemistry", F. A. Cotton and G. Wilkinson, $3^{rd}$ ed., Wiley Interscience is: "The terms 'coordination compound' and 'complex' may be broadly defined to embrace all species, charged or uncharged, in which a central atom is surrounded by a set of outer or ligand atoms, whereby the energy of the system is lowered. (i.e. E>0 and/or G<0). An example of a neutral complex is $SF_6$, where the central S atom is surrounded by 6 F atoms in an octahedral arrangement. An example of a positive complex ion is $[Cu(NH_3)_4]^{2+}$, where the central Cu atom is surrounded by 4 $NH_3$ molecules in a tetrahedral arrangement. An example of a negative complex ion is $[Cu(Cl)_5]^{3-}$, where the central Cu atom is surrounded by 5 Cl atoms in a pentagonal bipyramid arrangement." Examples of common ligands, which in the slurries of this invention are called complexing agents, are acetic acid, citric acid, ethyl acetoacetate, glycolic acid, glyoxylic acid, lactic acid, malic acid, oxalic acid, salicylic acid, sodium diethyldithiocarbamate, succinic acid, tartaric acid, thioglycolic acid, glycine, alanine, aspartic acid, ethylene diamine, trimethylene diamine, 1,2 ethanedithiol, 1,4 dithiothreitol, bis(methylthio)methane, dimethyldithiocarbamate, 5-methyl 3,4 thiadiazole-2-thiol, malonic acid, gluteric acid, 3-hydroxybutyric acid, proprionic acid, pthallic acid, isopthallic acid, 3-hydroxy salicylic acid, 3,5-dihydroxy salicylic acid, and galic acid.

The slurries of this invention may optionally comprise a dispersant. Aqueous CMP slurries contain submicron abrasive particles. The size of these particles is important to the performance of the slurry as well as to the resultant surface quality. If the abrasive particles agglomerate, the polishing removal rates may change and the surface quality may deteriorate. Dispersants can be included in the slurry formulation to prevent this agglomeration of abrasive particles. Dispersants can be anionic, cationic, or nonionic. The selection of the proper dispersant depends on many factors including the surface characteristics of the abrasive particles and the ionic nature of the slurry formulation. Some examples of ionic surfactants include sodium lauryl sulfate, cetyl-trimethyl ammonium bromide.

The oxidizing agent in the compositions of the present invention may be comprised of any of the common oxidizing agents such as nitrates, iodates, chlorates, perchlorates, chlorites, sulphates, persulphates, peroxides, ozonated water, and oxygenated water. Oxidizing agents can be used in slurries for CMP at concentrations of about 0.01% to about 7% by weight. Generally they are used at concentrations of about 1% to about 7% by weight. An iodate is a preferred oxidizing agent. Most preferred is potassium iodate at about 2% to about 4% by weight.

In the examples presented below, silica and titania were predominantly used as the abrasive component in the slurries tested. However, any metal oxide or polishing abrasive (such as alumina, ceria, zirconia, barium carbonate, or diamond) could also be used.

EXAMPLES

Unless otherwise indicated, all percentages mentioned in the following examples are by weight in the slurries described.

Example 1

Table 1 shows the results of polishing copper, tantalum, and silicon dioxide (formed from TEOS) wafers containing various amounts of complexing agents and oxidants. These experiments were carried out on an IPEC/Westech 372U polisher using a Rodel IC1400 pad under the conditions of 5 psi down pressure, 60 rpm carrier speed, 50 rpm platen speed, and a slurry flowrate of 110 ml/min. 6 inch sheet wafers were used. All slurries in this example contain 10% colloidal silica abrasive (Klebosol 1498), were at a pH of 10.5, and were adjusted to that pH with varying amounts of potassium hydroxide.

TABLE 1

| Sample | % Oxalic Acid | % Hydrogen Peroxide | RR Cu | RR Ta | RR SiO$_2$ |
|---|---|---|---|---|---|
| 1 | 0 | 0 | 202 | 340 | 1149 |
| 2 | 0 | 2 | 314 | 495 | 1261 |
| 3 | 3 | 0 | 214 | 416 | 1264 |
| 4 | 3 | 2 | 2038 | 1035 | 1202 |

These results show that in order to get high removal rates of both copper and the tantalum, it is necessary to have both a complexing agent that increases the solubility of both metals in aqueous solution, as well as contain a oxidant such as hydrogen peroxide. With this combination of components, it is possible to have satisfactory removal rates of copper while retaining a good selectivity (approximately 2:1) between the removal rates of copper and tantalum. It is also apparent from this example that additional components are needed to inhibit the removal rate of silicon dioxide.

Example 2

Table 2 shows the results of polishing copper and silicon dioxide (formed from TEOS) wafers containing various amounts of agents that are thought to suppress oxide removal. These experiments were carried out on an IPEC/Westech 372U polisher using a Rodel IC1400 pad under the conditions of 5 psi down pressure, 3 psi back pressure, 60 rpm carrier speed, 50 rpm platen speed, and a slurry flowrate of 110 ml/min. 6 inch sheet wafers were used. All slurries in this example contain 10% colloidal silica abrasive (Kiebosol 1498), 3% oxalic acid, 0.2% ammonium hydroxide, 0.2% hydrogen peroxide, and were adjusted to the pH listed with varying amounts of potassium hydroxide. The polyvinylpyrrolidone (PVP) used in the experiment below has a molecular weight between 10,000 and 30,000 daltons (i.e. has a degree of polymerization between 90 and 270). Sodium dodecyl sulfate (SDS), a traditional surfactant with a polar functional group and a long-chain hydrocarbon tail, is also tested for comparison.

TABLE 2

| Sample | % PVP | % SDS | pH | RR Cu | RR SiO$_2$ | Cu:SiO$_2$ Selectivity |
|---|---|---|---|---|---|---|
| 1 | 0 | 0 | 6 | 8566 | 1070 | 8 |
| 2 | 0 | 0 | 8 | 8166 | 1066 | 7.7 |
| 3 | 1 | 0 | 6 | 6727 | 133 | 50 |
| 4 | 1 | 0 | 8 | 7207 | 129 | 56 |
| 5 | 0 | 0.5 | 6 | 8591 | 1093 | 7.9 |
| 6 | 0 | 0.5 | 8 | 8187 | 1076 | 7.6 |

These results show that in order to get high removal rates of copper and low removal rates of silicon dioxide (i.e., high selectivities), it is necessary to have an additional component such as PVP to suppress the silicon dioxide removal rate while not suppressing the copper removal rate. Also, traditional surfactants like SDS are observed not to significantly effect the removal rate of oxide or copper films.

Example 3

Table 3 shows the results of polishing copper and tantalum wafers containing various amounts of complexing agents and oxidants. These experiments were carried out on an IPEC/Westech 372U polisher using a Rodel IC1400 pad under the conditions of 5 psi down pressure, 3 psi back pressure, 60 rpm carrier speed, 50 rpm platen speed, and a slurry flowrate of 110 ml/min. 6 inch sheet wafers were used. All slurries in this example contain 10% colloidal silica abrasive (Klebosol 1498), 0.75% of PVP, and were adjusted to that pH with varying amounts of nitric acid or potassium hydroxide.

TABLE 3

| Sample | % Oxalic Acid | % Hydrogen Peroxide | pH | RR Cu | RR Ta |
|---|---|---|---|---|---|
| 1 | 0 | 0 | 2.5 | 206 | 920 |
| 2 | 0 | 0 | 6 | 226 | 132 |
| 3 | 0 | 2 | 2.5 | 866 | 372 |
| 4 | 0 | 2 | 6 | 256 | 312 |
| 5 | 2 | 0 | 2.5 | 115 | 442 |
| 6 | 2 | 0 | 6 | 75 | 249 |
| 7 | 2 | 2 | 2.5 | 6237 | 430 |
| 8 | 2 | 2 | 6 | 1490 | 489 |

These results show that in order to get high removal rates of copper while retaining good tantalum removal rates, it is necessary to have both an oxidant and a complexing agent contained in the slurry.

Example 4

Table 4 shows the results of polishing copper, tantalum, tantalum nitride, and titanium wafers at two different pH levels. These experiments were carried out on an IPEC/Westech 372U polisher using a Rodel IC1400 pad under the conditions of 5 psi down pressure, 3 psi back pressure, 50 rpm carrier speed, 60 rpm platen speed, and a slurry flowrate of 120 ml/min. 6 inch sheet wafers were used. All slurries in this example contain 7% titania abrasive (Degussa P-25), 0.7% of PVP, 4% oxalic acid, 1% hydrogen peroxide, and were adjusted to the specified pH by varying the amount of potassium hydroxide.

TABLE 4

| Sample | pH | RR Cu | Cu:Ta Selectivity | Cu:TaN Selectivity | Cu:Ti Selectivity | Cu:SiO$_2$ Selectivity |
|---|---|---|---|---|---|---|
| 1 | 5.0 | 2950 | 7 | 3 | — | >100 |
| 2 | 6.2 | 1600 | 3.9 | 1.3 | 2.6 | >100 |

These results show that, by using an oxide suppressant, such as PVP, very high Cu:SiO$_2$ selectivities (above 100:1) can be achieved.

Example 5

Table 5 shows the results of polishing patterned wafers. These experiments were carried out on an IPEC/Westech 372U polisher. For Sample 1, a Rodel IC1400/K-XY pad was used with the polishing conditions of 3 psi down pressure, 2 psi back pressure, 40 rpm carrier speed, 65 rpm platen speed, and a slurry flowrate of 150 ml/min. For Sample 2, a Rodel IC1000 pad under the conditions of 4 psi down pressure, 3 psi back pressure, 75 rpm carrier speed, 60 rpm platen speed, and a slurry flowrate of 150 ml/min. All slurries in this example contain 7% titania abrasive (Degussa P-25), 0.7% of PVP, 4% oxalic acid, 1% hydrogen peroxide, and were adjusted to the specified pH by varying the amount of potassium hydroxide.

TABLE 5

| Sample | pH | Dishing 1 micron line | Dishing 100 micron pad | Oxide Erosion 50% pattern density |
|---|---|---|---|---|
| 1 | 5.0 | 1836 | 1390 | 49 |
| 2 | 6.2 | 1120 | — | 560 |

These results show that the oxide erosion experienced with slurries containing compounds such as PVP is much lower than that typically observed.

Example 6

The use of a polymeric additive has been shown to be effective at a wide range of dosing levels. In this example, PVP was added to a copper polishing slurry at a level of about 4% based on the total abrasive using the slurry preparation method described above. Polishing performance was measured using a Strasbaugh 6EC with a down force of 5 psi and a platten speed of 80 rpm. Slurry flow rate was 150 ml/min.

In this example, the test slurry comprised KIO3 as an oxidant and lactic acid as a copper complexing agent, and 4% PVP based on the abrasive present. The polishing removal rate results are given in Table 6 below.

TABLE 6

Removal Rate Performance of a PVP containing Copper Slurry

| Copper RR (A.min) | TaN RR (A/min) | Oxide RR (A/min) |
|---|---|---|
| 4465 | 137 | 165 |

Based on the data in Table 6, it is clear that PVP can be utilized at low concentrations in a metal polishing slurry in order to achieve good selectivity and low oxide removal rates.

Nothing in the foregoing Examples and discussion should in any way limit the scope of the present invention which is given in the claims to follow.

What is claimed is:

1. A method for chemical/mechanical planarization, of a semiconductor substrate having silicon dioxide underlying a layer of metal, the layer of metal to be removed by chemical/mechanical planarization, comprising the steps of:
   applying an aqueous solution to a polishing pad during relative movement between the substrate and the polishing pad, with the substrate and the polishing pad pressing against each other to remove the layer of metal, the aqueous solution containing an organic polymer dissolved in the aqueous solution,
   oxidizing the metal with an oxidant in the aqueous solution to produce ions of the metal,
   increasing solubility of the ions in the aqueous solution by complexing the ions with a complexing agent in the aqueous solution, and
   inhibiting removal of the silicon dioxide during removal of the layer of metal by bonding the organic polymer with silanol surface groups on the silicon dioxide.

2. The method as recited in claim 1 wherein the inhibiting the silicon dioxide includes the organic polymer having a degree of polymerization of at least 3 and a molecular weight greater than 10,000.

3. The method as recited in claim 1 wherein the inhibiting the silicon dioxide includes the organic polymer having plurality of moieties selected from the group consisting of hydroxy, carboxy, carbonyl, alkoxy, sulphonyl and phosphonyl.

4. The method as recited in claim 1 wherein the inhibiting the silicon dioxide includes the organic polymer being selected from the group consisting of polyvinyl alcohol, polyvinylpyrrolidone, polymethylmethacrylate, polyformaldehyde, polyethylene oxide, polyethylene glycol and polymethacrylic acid.

5. The method as recited in claim 1 wherein the inhibiting the silicon dioxide includes the organic polymer being polyvinyl alcohol.

6. The method as recited in claim 1 wherein the inhibiting the silicon dioxide includes the organic polymer being polyvinylpyrrolidone.

7. The method as recited in claim 1 wherein the inhibiting the silicon dioxide includes the organic polymer being polymethylmethacrylate.

8. The method as recited in claim 1 wherein the inhibiting the silicon dioxide includes the organic polymer being polyformaldehyde.

9. The method as recited in claim 1 wherein the inhibiting the silicon dioxide includes the organic polymer being polyethylene oxide.

10. The method as recited in claim 1 wherein the inhibiting the silicon dioxide includes the organic polymer being polyethylene glycol.

11. The method as recited in claim 1 wherein the inhibiting the silicon dioxide includes the organic polymer being polymethacrylic acid.

12. A method for polishing by chemical/mechanical planarization, of a semiconductor substrate having silicon dioxide underlying a layer of metal, the layer of metal to be removed by polishing with a polishing pad and an aqueous solution comprising the steps of:
   applying the aqueous solution to a polishing pad during relative movement between the substrate and the polishing pad, with the substrate and the polishing pad pressing against each other to remove the layer of metal, the aqueous solution containing an organic polymer dissolved in the aqueous solution, the organic polymer having a degree of polymerization of at least 3 and a molecular weight greater than 10,000,
   oxidizing the metal with an oxidant in the aqueous solution to produce ions of the metal,
   increasing solubility of the ions in the aqueous solution by complexing the ions with a complexing agent in the aqueous solution, and
   inhibiting removal of the silicon dioxide during removal of the layer of metal by bonding an organic polymer in the aqueous solution with silanol surface groups on the silicon dioxide.

13. The method as recited in claim 12 wherein the inhibiting the silicon dioxide includes the organic polymer having a plurality of moieties selected from the group consisting of hydroxy, carboxy, carbonyl, alkoxy, sulphonyl, phosphonyl or the like.

14. The method as recited in claim 12 wherein the inhibiting the silicon dioxide includes the organic polymer being selected from the group consisting of polyvinyl alcohol, polyvinylpyrrolidone, polymethylmethacrylate, polyformaldehyde, polyethylene oxide, polyethylene glycol and polymethacrylic acid.

15. The method as recited in claim 12 wherein the inhibiting the silicon dioxide includes the organic polymer being polyvinyl alcohol.

16. The method as recited in claim 12 wherein the inhibiting the silicon dioxide includes the organic polymer being polyvinylpyrrolidone.

17. The method as recited in claim 12 wherein the inhibiting the silicon dioxide includes the organic polymer being polymethylmethacrylate.

18. The method as recited in claim 12 wherein the inhibiting the silicon dioxide includes the organic polymer being polyformaldehyde.

19. The method as recited in claim 12 wherein the inhibiting the silicon dioxide includes the organic polymer being polyethyleneoxide.

20. The method as recited in claim 12 wherein the inhibiting the silicon dioxide includes the organic polymer being polyethyleneglycol.

21. The method as recited in claim 12 wherein the inhibiting the silicon dioxide includes the organic polymer being polymethacrylic acid.

\* \* \* \* \*